(12) United States Patent
Green et al.

(10) Patent No.: US 8,592,878 B2
(45) Date of Patent: Nov. 26, 2013

(54) SEMICONDUCTOR DEVICES WITH LOW LEAKAGE SCHOTTKY CONTACTS

(75) Inventors: Bruce M. Green, Gilbert, AZ (US); Haldane S. Henry, Scottsdale, AZ (US); Chun-Li Liu, Scottsdale, AZ (US); Karen E. Moore, Phoenix, AZ (US); Matthias Passlack, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 21 days.

(21) Appl. No.: 13/042,948

(22) Filed: Mar. 8, 2011

(65) Prior Publication Data

US 2011/0156051 A1 Jun. 30, 2011

Related U.S. Application Data

(62) Division of application No. 11/950,820, filed on Dec. 5, 2007, now Pat. No. 7,935,620.

(51) Int. Cl.
*H01L 29/66* (2006.01)

(52) U.S. Cl.
USPC ............ 257/280; 257/78; 257/E29.041

(58) Field of Classification Search
USPC ............ 257/76, 288, 78, 280, E29.041; 438/570, 571, 576
See application file for complete search history.

(56) References Cited

U.S. PATENT DOCUMENTS

| | | | |
|---|---|---|---|
| 4,213,840 A | 7/1980 | Omori et al. | |
| 4,965,218 A | 10/1990 | Geissberger et al. | |
| 5,192,695 A | 3/1993 | Wang et al. | |
| 5,923,072 A | 7/1999 | Wada et al. | |
| 7,045,404 B2 | 5/2006 | Sheppard et al. | |
| 2001/0012652 A1 | 8/2001 | Matsuda | |
| 2002/0008248 A1 | 1/2002 | Igarashi et al. | |
| 2002/0179909 A1 | 12/2002 | Uchida et al. | |
| 2003/0160269 A1* | 8/2003 | Inoue et al. | 257/213 |
| 2004/0147054 A1* | 7/2004 | Haberern et al. | 438/39 |
| 2004/0159865 A1 | 8/2004 | Allen et al. | |
| 2005/0170574 A1 | 8/2005 | Sheppard et al. | |
| 2006/0091498 A1* | 5/2006 | Sriram et al. | 257/578 |
| 2006/0223326 A1 | 10/2006 | Nishi | |
| 2007/0241419 A1 | 10/2007 | Green et al. | |

* cited by examiner

*Primary Examiner* — Kimberly Rizkallah
*Assistant Examiner* — Duy T Nguyen
(74) *Attorney, Agent, or Firm* — Sherry W. Schumm

(57) ABSTRACT

Embodiments include semiconductor devices with low leakage Schottky contacts. An embodiment is formed by providing a partially completed semiconductor device including a substrate, a semiconductor on the substrate, and a passivation layer on the semiconductor, and using a first mask, locally etching the passivation layer to expose a portion of the semiconductor. Without removing the first mask, a Schottky contact is formed of a first material on the exposed portion of the semiconductor, and the first mask is removed. Using a further mask, a step-gate conductor of a second material electrically coupled to the Schottky contact is formed overlying parts of the passivation layer adjacent to the Schottky contact. By minimizing the process steps between opening the Schottky contact window in the passivation layer and forming the Schottky contact material in this window, the gate leakage of a resulting field effect device having a Schottky gate may be substantially reduced.

12 Claims, 6 Drawing Sheets

SEMICONDUCTOR DEVICES WITH LOW LEAKAGE SCHOTTKY CONTACTS

CROSS REFERENCE TO RELATED APPLICATION

This application is a divisional of U.S. Pat. No. 7,935,620 of U.S. patent application Ser. No. 11/950,820, filed on Dec. 5, 2007.

TECHNICAL FIELD

The present invention generally relates to electronic devices, and more particularly relates to structure and method for semiconductor devices employing a Schottky contact.

BACKGROUND

Semiconductor (SC) devices, especially transistors are often sensitive to leakage currents from conductor and interconnections into the semiconductor bulk or substrate, and/or to surface states that may upset the electrical potential in critical device regions. In many cases, leakage currents associated with Schottky contacts of field effect and other devices can be especially troublesome. These effects can degrade the operation of the device. What is done to mitigate one problem may adversely affect the other. A further difficulty is that processing steps used to form and/or etch various masks, layers and/or device regions can adversely interact to the detriment of the overall device properties, for example by introducing surface defects in critical device regions. Such effects are especially encountered with semiconductors that lack a natural passivating oxide, such as is available in the silicon-silicon dioxide system. Accordingly, there is a need for improved device structures and methods of fabrication that can mitigate or eliminate such effects.

Accordingly, it is desirable to provide improved semiconductor devices and methods, especially field effect transistors and arrays of field effect transistors and other electronic devices employing Schottky contacts and methods for forming them, where Schottky contact leakage and surface state effects are reduced, and which are suitable for use with various type IV, III-V, II-VI materials and organic semiconductor compounds. It is further desirable that the methods, materials and structures employed be compatible with present day manufacturing capabilities and materials and not require substantial modifications of available manufacturing procedures or substantial increase in manufacturing costs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

Figure 1:
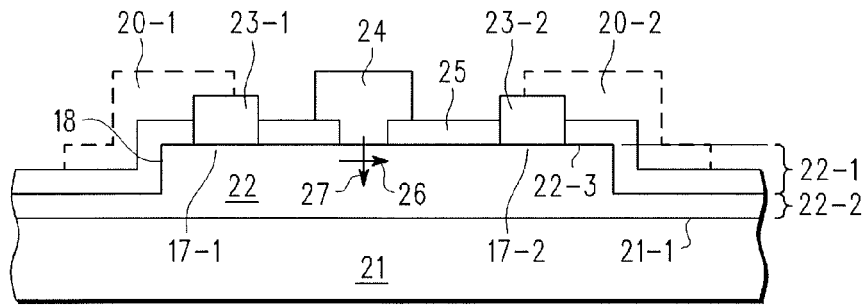
FIG. 1 is a simplified schematic cross-sectional view through a field effect transistor (FET) employing a Schottky contact showing the arrangement of various device regions.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and manufacturing techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down, "top," "bottom," "over," "under," "above," "below" and the like in the description and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner.

For convenience of explanation and not intended to be limiting, the present invention is described for electronic devices being formed using GaN semiconductor material, but this is not essential and the principles taught herein apply to a wide variety of semiconductor materials and devices adapted to operate at many different frequencies or clock speeds. Non-limiting examples of other suitable semiconductor materials are SiC, AlGaN, diamond, and various other type IV, III-V and II-VI compounds and mixtures thereof and organic semiconductors. Accordingly, while GaN is identified a suitable semiconductor material, the present invention is not limited thereto. Further, for convenience of explanation and not intended to be limiting, the present invention is described for a heterojunction field effect transistor (HFET), but persons of skill in the art will understand based on the description herein that the present invention is not limited merely to HFETs but applies to a wide variety of field effect transistors (FETs) and other devices employing Schottky contacts.

FIG. 1 is a simplified schematic cross-sectional view through heterojunction field effect transistor (HFET) 19 showing the arrangement of various device regions 21-26. Device 19 is formed in semiconductor (SC) 22 located on surface 21-1 of substrate 21. Substrate 21 may be of sapphire, Si, SiC, diamond, GaN, AlN and various other generally refractory materials. It is desirable that substrate 21 be substantially electrically insulating.

Figure 2:
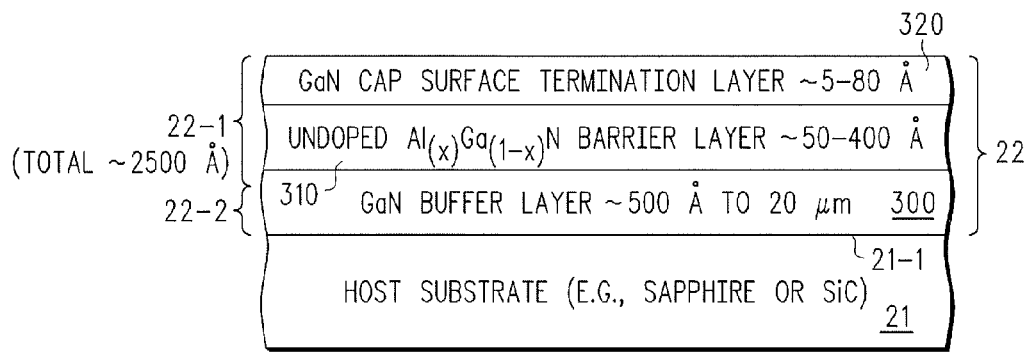
FIG. 2 is a simplified schematic cross-sectional view through a portion of the device of FIGS. 1 and 4-14, providing additional details.

Further details of the construction of device 19 are shown in FIG. 2. In this example, SC 22 is comprised of GaN buffer layer 300 with a useful thickness of approximately 500 Angstrom (abbreviated in FIG. 2 as "Å") units to 20 micro-meters (abbreviated in FIG. 2 as "μm") with $Al_xGa_{1-x}N$ barrier layer 310 wherein x is preferably in the range of about $0.2 \le x \le 0.3$, and having a useful thickness approximately between 50 and 400 Angstrom units to form a heterojunction. Thicknesses in the range of 1-2 micro-meters are preferred for GaN buffer layer 300 and 150-250 Angstrom units are generally preferred for $Al_xGa_{1-x}N$ barrier layer 310. In addition, the surface is preferably terminated with GaN cap or surface termination layer 320 with a thickness that ranges between approximately 5 and 80 Angstrom units. GaN cap layer thicknesses in the range of about 10-40 Angstrom units are preferred. GaN is a III-V compound, but other type IV, III-V, II-VI and organic semiconductor materials may also be used. Layers 300, 310, 320 can be formed by metal-organic chemical vapor deposition (MOCVD), or by molecular beam epitaxy (MBE), or by hydride vapor phase epitaxy (HVPE) or a combination thereof. MOCVD is preferred. The details shown in FIG. 2 apply to the devices of FIGS. 1, 4-9 and 10-14.

Referring again to FIG. 1, mesa or island 18 containing field effect device 19 is formed in upper portion 22-1 of SC 22. Mesa 18 in upper portion 22-1 provides device-to-device isolation, while lower portion 22-2 of SC 22 provides a transition zone so that crystalline imperfections that may arise at interface surface 21-1 between SC 22 and substrate 21 do not significantly detract from device performance. In most cases, upper portion 22-1 is thinner than lower portion 22-2, but the thickness of upper portion 22-1 has been exaggerated in this and subsequent figures to facilitate understanding. Dielectric passivation layer 25 generally covers upper surface 22-3 of SC 22 except where various electrodes 23-1, 23-2 and 24 are provided in contact with surface 22-3 of SC 22. $Si_3N_4$, $SiO_2$, $SiO_xN_y$, AlN, $Al_2O_3$, $HfO_2$ and combinations or mixtures thereof are suitable dielectrics for passivation layer 25, but $Si_3N_4$ is preferred for GaN semiconductors. Thicknesses in the range of about 20 to 5000 Angstrom units are useful for layer 25 with about 500 to 1000 Angstrom units being preferred. Layer 25 may be substantially homogeneous or a layered or graded structure and of materials other than $Si_3N_4$ according to the desires of the designer and the semiconductor materials chosen for the device.

Source region 17-1 with source contact 23-1 and drain region 17-2 with drain contact 23-2 are formed on surface 22-3 of SC 22 in openings provided in passivation layer 25 using techniques well known in the art, which may vary depending upon the particular material(s) chosen for SC 22 and passivation layer 25. Contacts 23-1, 23-2 are conveniently of metals or metal alloys chosen so as to make substantially ohmic contacts to SC 22. Gate 24 of conductive material is formed over channel region 26 on surface 23-3 of SC 22. For a HFET or a metal-semiconductor field effect device (MESFET) and other devices, it is desirable that gate 24 is of a material that makes Schottky contact to SC 22, thereby providing the control electrode of field effect device 19 over channel region 26. Conductive interconnection 20-1 conveniently but not essentially electrically couples source contact 23-1 to various other devices or elements (not shown) and drain interconnection 20-2 conveniently but not essentially electrically couples drain contact 23-2 to various other devices or elements (not shown). The conductor of gate 24 can also extend to such other elements or devices, so that device 19 is a single device coupled to bonding pads or one of a large array of devices forming a complex integrated circuit. The present invention does not depend on whether the devices described herein are a single device or one of many in an array of integrated devices.

Figure 3:
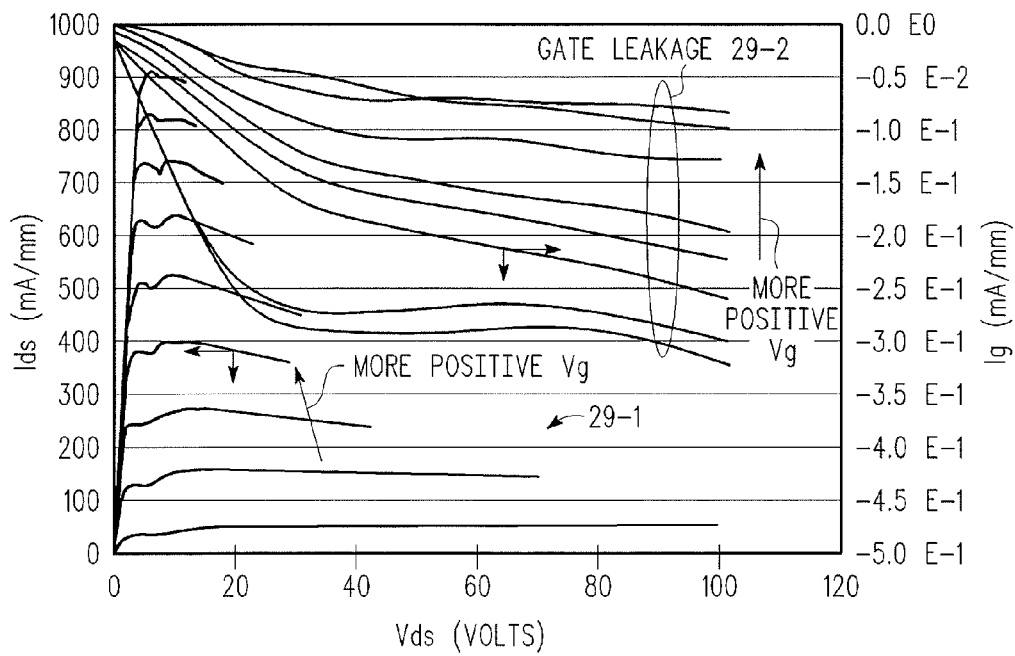
FIG. 3 is a simplified plot of drain-source current (Ids) versus drain-source voltage (Vds) and gate leakage current (Ig) versus Vds for a device of the type illustrate in FIG. 1 and formed according to the procedures illustrated in FIGS. 4-9, illustrating the occurrence of excess gate leakage current Ig.
Figure 4:
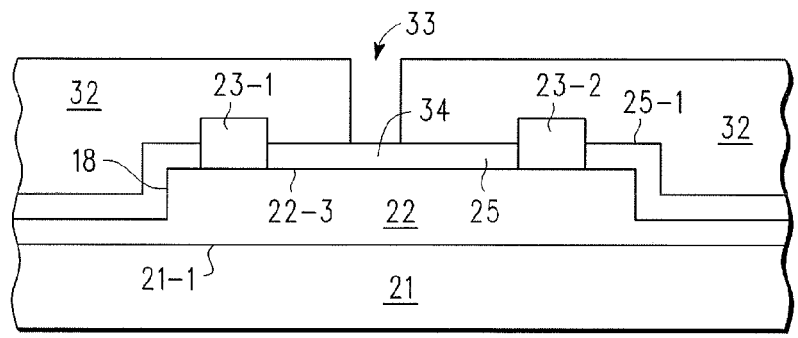
FIGS. 4-9 are simplified cross-sectional views through the device of FIG. 1 at different stages of manufacture, that results in a device having the properties shown in FIG. 3.
Figure 5:
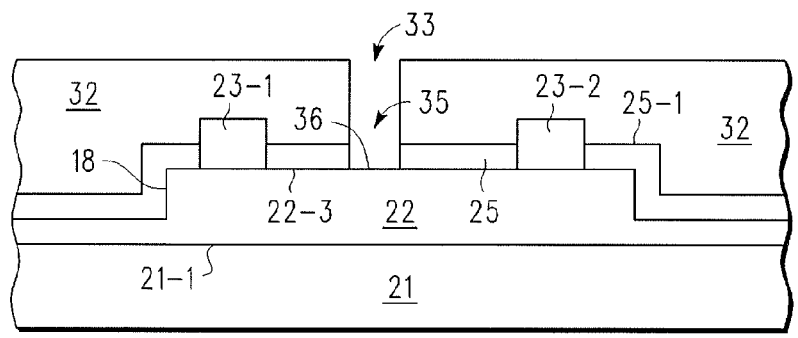
Figure 6:
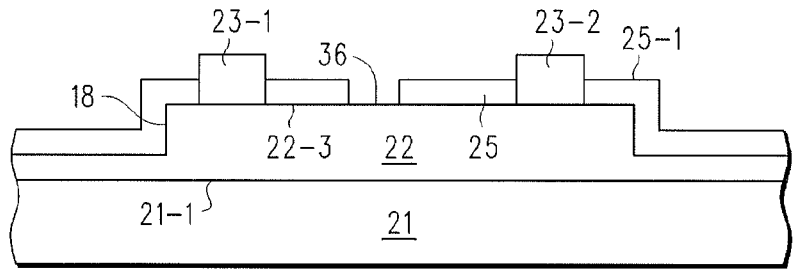
Figure 7:
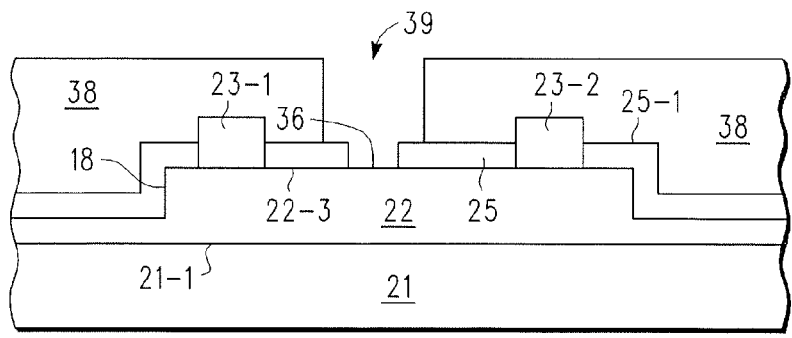
Figure 8:
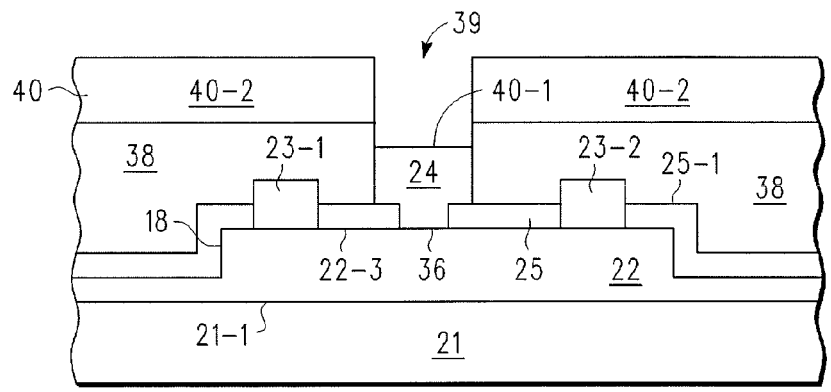

When appropriate voltages are applied to device 19, channel 26 forms under gate 24 so that current Ids can flow between source electrode 23-1 and drain electrode 23-2 in response to the applied drain-source voltage Vds, under the control of voltage (Vg) applied to gate 24. It is also the case that under these conditions gate leakage current Ig, indicated by arrow 27, can flow from gate 24 to source and/or drain electrodes 23-1, 23-2, and even into substrate 21 if conducting. FIG. 3 shows simplified plot 28 of drain-source current (Ids) versus drain-source voltage (Vds) and gate leakage current (Ig) versus drain-source voltage (Vds) for a device of the type shown in FIG. 1 and formed according to the manufacturing sequence shown in FIGS. 4-9. The occurrence of excess gate leakage current Ig is illustrated in FIG. 3. Traces 29-1 referring to the left ordinate scale and abscissa show Ids versus Vds for different gate voltages Vg. Traces 29-2 referring to the right ordinate scale and abscissa show Ig versus Vds for various values of Vg. The directions of more positive Vg are indicated for both groups of traces. It will be noted that undesirably large values of Ig are observed with this device. It is believed that this excess gate current arises as a consequence of the fabrication sequence (see FIGS. 4-9) used in manufacturing the device, a sequence that is believed to adversely affect surface 22-3 in the vicinity of gate 24.

FIGS. 4-9 are simplified cross-sectional views through the device of FIG. 1 at different stages 30-1 to 30-6 of manufacture, which results in a device having the properties shown in FIG. 3. Like reference numbers are used to identify like regions in the device. Referring now to manufacturing stage 30-1 illustrated in FIG. 4, several conventional manufacturing stages have preceded manufacturing stage 30-1 such that substrate 21 has already been provided, SC 22 and overlying passivation layer 25 have already been formed thereon, and source and drain contacts 23-1, 23-2 have already been deposited and annealed using manufacturing techniques well known in the art. In manufacturing stage 30-1, mask 32 (e.g., photoresist) with opening 33 is provided on upper surface 25-1 of passivation layer 25, resulting in structure 31-1. Portion 34 of passivation layer 25 is exposed in opening 33. In manufacturing stage 30-2 of FIG. 5, opening 35 is etched in portion 34 of passivation layer 25 exposed in opening 33, thereby exposing portion 36 of SC 22 where channel 26 (see FIG. 1) is desired to be located. Etching is desirably performed by what is referred to as a "low damage" etch, as for example, using $SF_6$ or $CF_4$ inductively coupled plasma (ICP) etching for the case where passivation layer 25 is $Si_3N_4$. This provides structure 31-2. In manufacturing stage 30-3 of FIG. 6, mask 32 is removed, thereby providing structure 31-3. Photoresist mask removal is conveniently accomplished by a standard resist strip and ash. This is followed by an anneal treatment, well known in the art to reduce the effects of damage caused by etching of the $Si_3N_4$ passivation layer 25. In manufacturing stage 30-4 of FIG. 7, mask 38 (e.g., photoresist) with opening 39 is applied so as to encompass region 36. In addition to applying and patterning resist mask 38, it is customary to include a "de-scum" and brief surface wet etch to insure that region 36 of surface 22-3 of SC 22 is open and clean of any oxide or other contaminants. This is to insure that in subsequent manufacturing stage 30-5 of FIG. 8, a Schottky contact can be made to SC 22. Opening 39 is desirably wider than opening 36 so as to reduce the required alignment tolerance and to provide (in the next manufacturing stage) a "step-gate" conductor for gate 24. Structure 31-4 results from manufacturing stage 30-4. In manufacturing stage 30-5 of FIG. 8, metal layer 40 is applied, with portion 40-1 in opening 39 making Schottky contact to region 36 of SC 22, thereby forming step gate 24. Structure 31-5 results. In manufacturing stage 30-6 of FIG. 9, mask 38 is removed (e.g., by standard resist strip solvent) and portions 40-2 of metal layer 40 lifted off at the same time so that structure 31-6 results. Interconnections 20-1, 20-2 may be provided at the same time as gate 24 during manufacturing stage 30-5 by including additional openings in mask 38 at the desired locations, or provided separately in subsequent conventional steps (not shown). Device 19 of FIG. 1 is obtained as a result of manufacturing stages 30-1 through 30-6 of FIGS. 4-9. It is believed that the excess gate leakage observed with devices manufactured according to the steps illustrated in FIGS. 4-9 is a consequence of the cumulative effects of the three plasma and four wet chemistry treatments used in carrying out these steps, as for example, gate dry etch of opening 35 during manufacturing stage 30-2, wet removal and plasma ashing of resist 32 prior to manufacturing stage 30-3, deposition of resist layer 38 at the beginning of manufacturing stage 30-4, resist developing to create resist opening 39 during manufacturing stage 30-4, resist de-scumming of opening 39 and exposed semiconductor region 36 during manufacturing stage 30-4, and surface pre-clean of opening 39 and exposed semiconductor region 36 during manufacturing stage 30-4 to provide structure 31-4.

It has been found that the gate leakage current Ig can be substantially reduced by modifying the manufacturing sequence for such devices, according to the embodiment illustrated in FIGS. 10-14. FIGS. 10-14 are simplified cross-sectional views through device 49 (see FIG. 14) analogous to device 19 of FIG. 1 at different stages of manufacture 50-1 through 50-5, according to an embodiment of the invention that provides a device having the improved properties shown in FIG. 15. The manufacture of device 49 follows the same procedure as that of device 19 through manufacturing stage 30-2 of FIG. 5, to obtain structure 31-2 of FIG. 5. Then, as shown in manufacturing stage 50-1 of FIG. 10, Schottky forming conductor 42 is applied over mask 32 and in opening 33 to provide Schottky contact 42-1 on portion 36 of SC 22. Prior to forming conductor 42, a low damage etch (e.g., $SF_6$ or $CF_4$ ICP etching) is used to penetrate passivation layer 25 and a brief clean-up "oxide" etch is used to remove any residual surface contamination from region 36 prior to deposition of Schottky forming conductor 42. When SC 22 is GaN, then Ni and Au are useful examples of suitable Schottky contact forming materials for conductor 42. Ni—Au is preferred but other conductors such as Ni—Au, Au, Pt, Pt—Au, Ni, Ni—Au, Ir, Ir—Au, Pd, Pd—Au, TiW and TiWN may also be used. What is important is that the material of conductor 42 is made of a high enough work function metal with appropriate adhesion properties to form a Schottky contact with SC 22. Structure 51-1 results. It will be noted that Schottky forming conductor 42 is deposited using the same mask (e.g., mask 32 with opening 33) that was used to etch through portion 35 of passivation layer 25 and expose portion 36 of surface 22-3 of SC 22. Stated another way, the mask (e.g., mask 32) used to open the contact window (e.g., opening 33) to portion 36 of SC 22 is not removed until after Schottky contact 42-1 is formed following the above-noted clean-up etch. This insures that a high quality Schottky contact is obtained, free from the adverse affects of surface states and other anomalies that were previously introduced by delaying the Schottky contact deposition until later in the manufacturing process of FIGS. 4-9, e.g., until after mask 32 had been removed. In manufacturing stage 50-2 of FIG. 11, photo resist mask 32 is removed using standard resist strip solvents along with overlying portions 42-2 of Schottky conductor 42 in a standard lift-off step well known in the art. Structure 51-2 results. In manufacturing stage 50-3 of FIG. 12, mask 44 (e.g., photoresist) with opening 45 is applied. Mask 44 is analogous to mask 38 of FIGS. 7-8 and opening 45 is analogous to opening 39 of FIGS. 7-8, except that opening 45 does not extend to surface portion 36 of SC 22. Structure 51-3 results. Opening 45 encompasses Schottky contact 42-1 and has width 46 that is larger than width 47 of Schottky contact 42-1. In manufacturing stage 50-4 of FIG. 13, conductor 48 is deposited on mask 44 and in opening 45 so that portion 48-1 is provided in good electrical contact with Schottky contact 42-1 on portion 36 of SC 22 and has "wings" extending over portions 25-2 of surface 25-1 of dielectric passivation layer 25 adjacent to Schottky contact 42-1. Conductor 48 is conveniently of Au, Ni—Au, Pt—Au or combinations thereof, with Ni—Au being preferred. Thicknesses in the range of about 10 to 200 nano-meters are convenient with about 700 nano-meters being preferred. Structure 51-4 results. In manufacturing stage 50-5 of FIG. 14, mask 44 and overlying portions 48-2 of conductor 48 are removed using a standard photoresist strip and liftoff step well known in the art. Structure 51-5 forming FET device 49 results. It will be noted that gate 54 of device 49 has a composite structure, that is, a first (lower) region with Schottky contact 42-1 on portion 36 of SC 22, and a second region with step-gate shaped gate conductor portion 48-1 that can be a non-Schottky forming material, whose "wings" overlap dielectric passivation 25 (e.g., in portions 25-2) on either side of Schottky contact 42-1, and that the first and second regions are formed in different deposition steps using different masks. Conductor portion 48-1 can be of the same or different material than Schottky contact 42-1.

Figure 9:
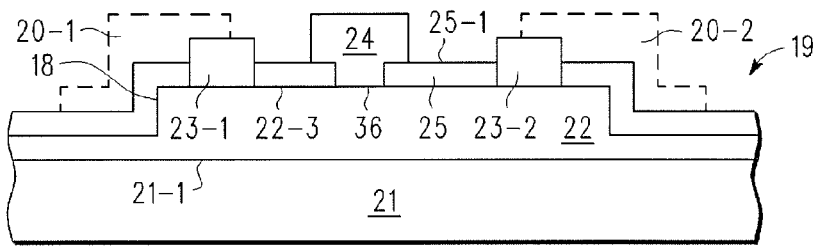
Figure 10:
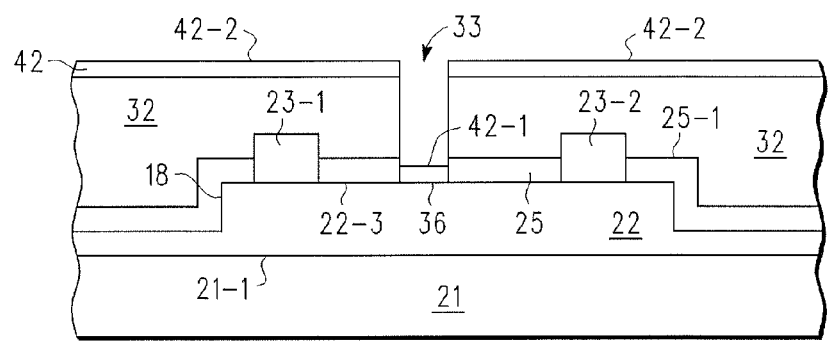
FIGS. 10-14 are simplified cross-sectional views at different stages of manufacture through a device analogous to the device of FIG. 1, according to an embodiment of the invention that provides a device having the improved properties shown in FIG. 15.
Figure 11:
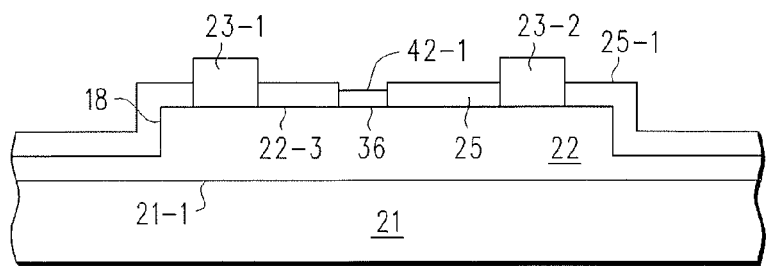
Figure 12:
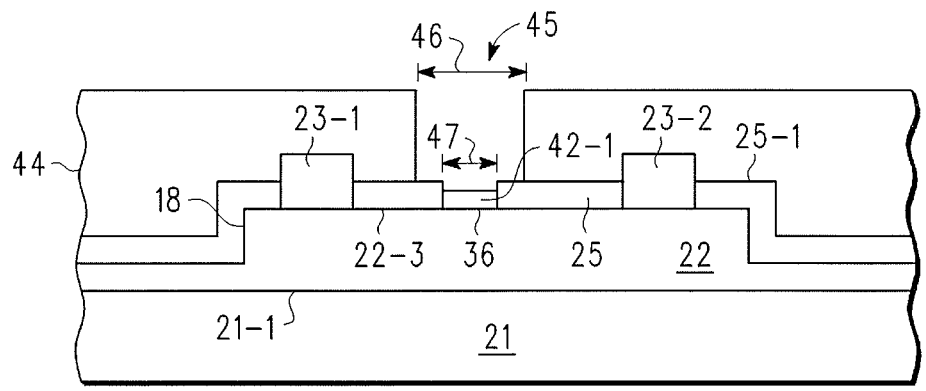
Figure 13:
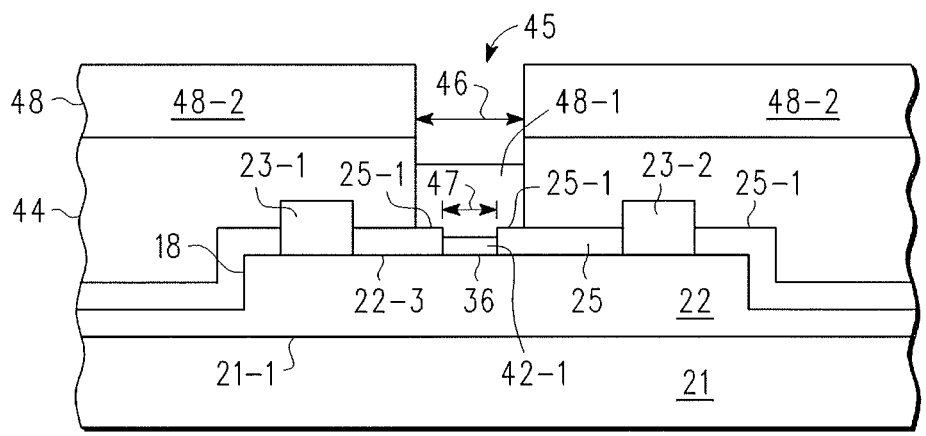
Figure 14:
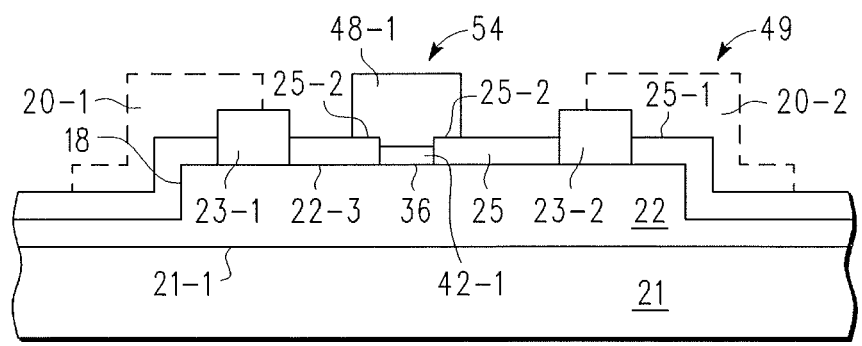
Figure 15:
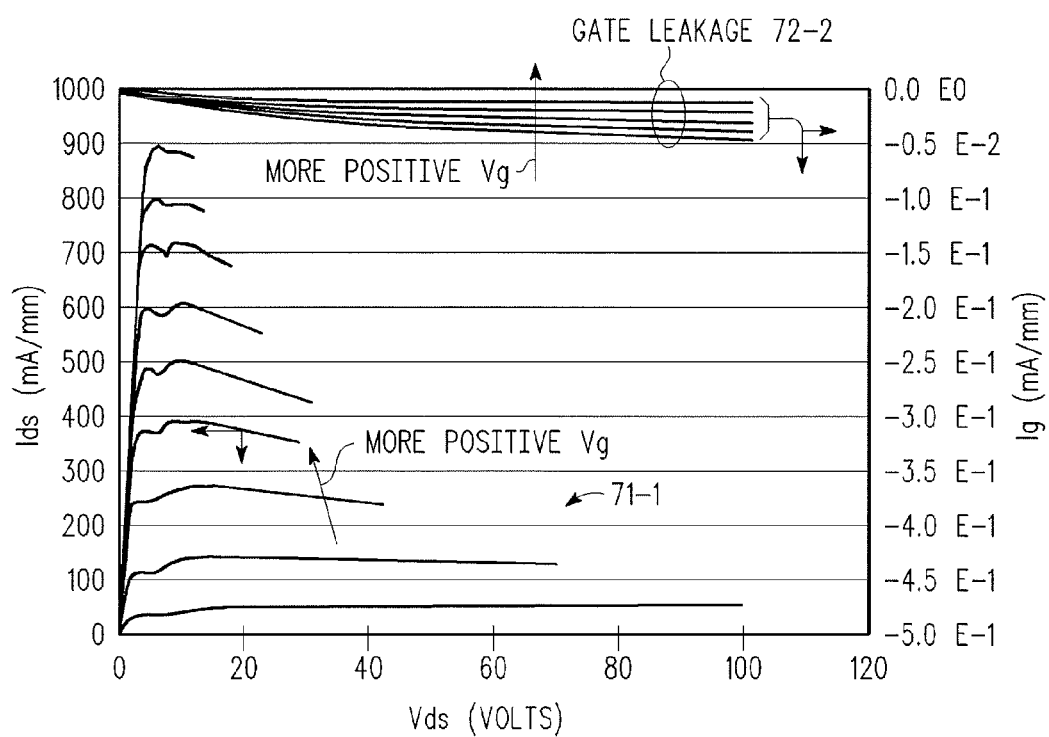
FIG. 15 shows a simplified plot of drain-source current (Ids) versus drain-source voltage (Vds) and gate leakage current (Ig) versus Vds for a device formed according to the procedures illustrated in FIGS. 10-14 and showing reduced gate leakage.

Resulting device 49 is analogous to device 19 of FIGS. 1 and 9 but without the excess leakage observed with devices manufactured according to FIGS. 4-9. FIG. 15 shows simplified plot 70 of drain-source current (Ids) versus drain-source voltage (Vds) and gate leakage current (Ig) versus drain-source voltage (Vds) for device 49 formed according to the procedures illustrated in FIGS. 10-14 and of substantially the same dimensions as that of device 19 formed according to FIGS. 4-9. Traces 71-1 referring to the left ordinate scale and abscissa show Ids versus Vds for difference gate voltages Vg. These traces are substantially the same as those observed for device 19 of FIGS. 1-9. Traces 71-2 referring to the right ordinate scale and abscissa show Ig versus Vds for various values of Vg. The directions of more positive Vg are indicated for both sets of traces. It will be noted that compared to device 19 made according to the manufacturing stages illustrated in FIGS. 1-9, device 49 made according to the manufacturing stages illustrated in FIGS. 10-15 has substantially reduced gate leakage current Ig. As can be seen in FIG. 15, the maximum gate leakage current of device 49 is about sixty times less than the maximum gate leakage current of device 19, with no significant change in the Ids versus Vds characteristics of the device. Stated another way, the maximum gate leakage current of device 49 made according to the manufacturing process illustrated in FIGS. 10-14 has been reduced by approximately 98% compared to device 19 made according to the manufacturing process illustrated in FIGS. 4-9, with no significant adverse affect on other device properties. This is a very significant improvement.

Figure 16:
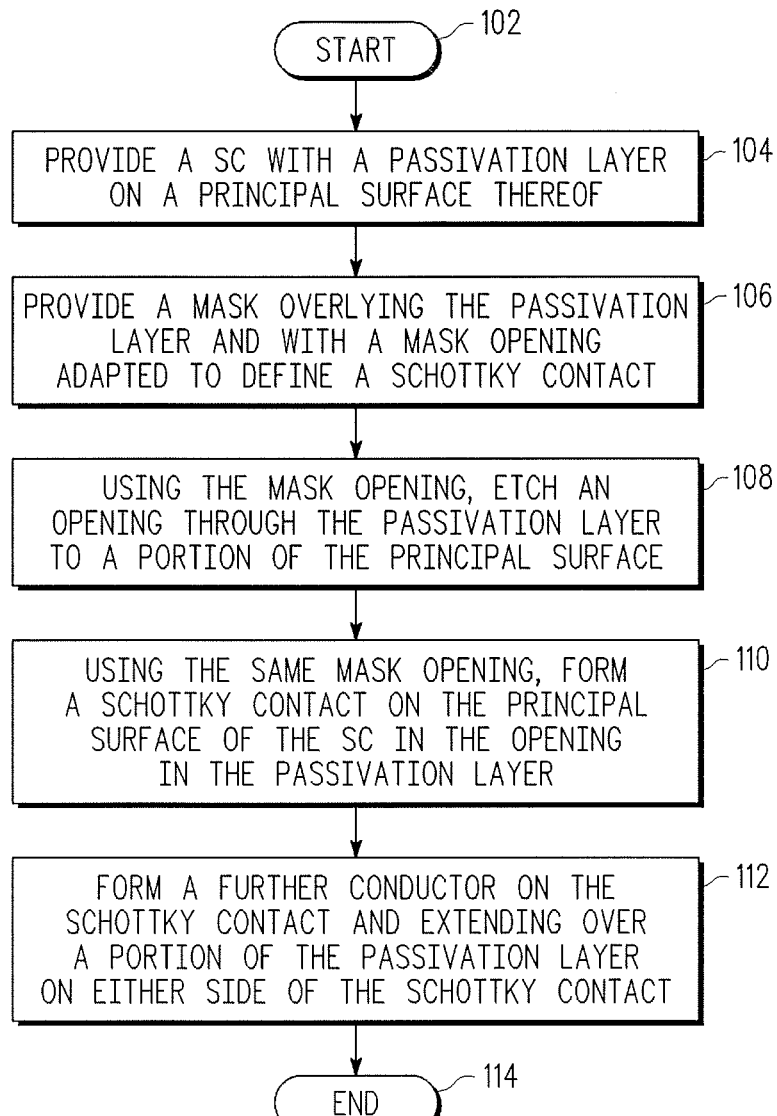
FIG. 16 is a simplified flow chart illustrating a method for forming a Schottky contact device according to a still further embodiment of the invention.

FIG. 16 shows a simplified flow chart illustrating method 100 for forming a Schottky contact device, as for example a field effect device, according to an embodiment of the invention and showing further details. Reference should also be had to the simplified cross-sectional views of FIGS. 10-14. Method 100 begins with START 102 and initial step 104 wherein a semiconductor (SC) with a surface dielectric passivation layer (e.g., layer 25) is provided using means well known in the art. Other (non-Schottky) contacts (e.g., contacts 23-1, 23-2) may have also been provided such as are illustrated in FIGS. 1 and 10-14. In subsequent step 106, a mask (e.g., mask 32) with a mask opening (e.g., opening 33) adapted to define a Schottky contact is provided, overlying the dielectric passivation layer (e.g., layer 25). In step 108, the dielectric passivation layer (e.g., layer 25) underlying the mask opening (e.g., opening 33) is etched away to expose a portion (e.g., portion 36) of the surface (e.g., surface 22-3) of the underlying semiconductor (e.g., SC 22). In step 110, the same mask opening (e.g., opening 33) is used to form a Schottky contact (e.g., contact 42-1) on the portion (e.g., portion 36) of the surface (e.g. surface 22-3) of the semiconductor (e.g., SC 22) in the opening in the dielectric passivation layer (e.g., layer 25). In subsequent step 112, a further conductor (e.g., conductor 48-1) is formed on the Schottky contact (e.g., contact 42-1) and extending over portions (e.g., surface portions 25-2) of the dielectric passivation layer (e.g., layer 25) lying on either side of the Schottky contact (e.g., contact 42-1). The foregoing steps create a low leakage Schottky contact. FET device 49 (see FIG. 14) may be completed by adding, for example, source-drain contacts 23-1, 23-2 before or after the above-listed steps. Before is preferred.

According to a first embodiment, there is provided a method for forming a semiconductor device with a Schottky contact, comprising, providing a semiconductor having a surface with a passivation layer on the surface, providing a mask overlying the passivation layer with a first mask opening adapted to define the Schottky contact, etching through the passivation layer under the mask opening to expose part of the surface, depositing through the mask opening a Schottky contact on the exposed part of the surface, and forming a further conductor on the Schottky contact and extending over portions of the passivation layer on either side of the Schottky contact. According to a further embodiment, the step of forming a further conductor comprises, providing another mask having another mask opening encompassing the Schottky contact and portions of the passivation layer on either side of the Schottky contact, and forming the further conductor through the another mask opening. According to a still further embodiment, the device is a field effect transistor and the Schottky contact is a control gate of the field effect transistor. According to a yet further embodiment, the semiconductor comprises a type IV, III-V or II-VI material or a combination thereof. According to a still yet further embodiment, the semiconductor comprises GaN. According to a yet still further embodiment, the passivation layer comprises $Si_3N_4$, $SiO_2$, $SiO_xN_y$, AlN, $Al_2O_3$, $HfO_2$, or combinations thereof. According to another embodiment, the Schottky contact comprises Ni, Au, Pt, Pt—Au, Ni—Au, Ir, Ir—Au, Pd, Pd—Au, TiW, TiWN or combinations thereof. According to a still another embodiment, the further conductor comprises Au, Ni—Au, Pt—Au, or combinations thereof. According to a yet another embodiment, the method further comprises before or after the listed steps, forming spaced-apart Ohmic source and drain contacts on the semiconductor, separated from the Schottky contact. According to a still yet another embodiment, the step of forming the spaced apart Ohmic source and drain contacts is carried out before the etching step. According to a yet still another embodiment, the step of forming the spaced apart Ohmic source and drain contacts is carried out after the step of depositing the Schottky contact.

According to a second embodiment, there is provided a semiconductor device made by a method comprising, providing a semiconductor with a passivation layer on the semiconductor surface, providing a first mask overlying the passivation layer with a first mask opening adapted to define the Schottky contact, etching through the passivation layer under the first mask opening to expose part of the semiconductor surface, depositing through the first mask opening a Schottky contact on the exposed part of the semiconductor surface, and forming a further conductor on the Schottky contact and extending over portions of the passivation layer on either side of the Schottky contact. According to a further embodiment, the semiconductor comprises a type IV, III-V, II-VI material or a combination thereof. According to a still further embodiment, the semiconductor comprises GaN. According to a yet further embodiment, the device is a field effect transistor. According to a still yet further embodiment, the device is made by the method further comprises forming spaced apart Ohmic source and drain contacts before or after depositing the Schottky contact.

According to a third embodiment, there is provided a method for forming a field effect transistor, comprising, providing a partially completed field effect transistor comprising a substrate, a semiconductor on the substrate and a passivation layer on a surface of the semiconductor; providing a first mask with a first opening therein overlying part of the passivation layer, etching the passivation layer through the first opening to expose a first portion of the surface of the semiconductor under the first opening, without removing the first mask, forming a Schottky contact of a first conductive material on the first portion of the surface of the semiconductor, removing the first mask, providing a second mask with a second opening wider than and encompassing the Schottky contact, and forming a step-gate conductor through the second opening, electrically coupled to the Schottky contact and overlying parts of the passivation layer adjacent to the Schottky contact. According to a further embodiment, the method further comprises before or after the listed steps, forming spaced-apart Ohmic source and drain contacts on the semiconductor, separated from the Schottky contact. According to a still further embodiment, the semiconductor comprises a type IV, III-V, II-VI material or combinations thereof. According to a yet further embodiment, the semiconductor comprises GaN, SiC, AlGaN or combinations thereof.

While at least one exemplary embodiment has been presented in the foregoing detailed description, it should be appreciated that a vast number of variations exist, especially with respect to choices of substrate 21, semiconductor 22, dielectric passivation layer 25, contacts, conductors and interconnections 23, 42-1, 48-1, 20-1 and 20-2. Further, while device(s) 19, 49 are shown as being formed in mesa(s) 18 for isolation purposes, persons of skill in the art will understand based on the description herein that other isolation arrangements may also be used according to further embodiments of the present invention, as for example, and not intended to be limiting, using etch and dielectric refill trenches and/or surrounding ion implanted regions forming the electrical equivalent of device mesa(s). Accordingly, as used herein, the term "mesa" as applied to the device(s) is intended to include such other forms of isolation. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor device with a Schottky contact, the semiconductor device comprising:
    a semiconductor having a semiconductor surface and a mesa in the semiconductor, wherein the mesa is defined by an upper portion of the semiconductor that is thicker than a lower portion of the semiconductor;
    a passivation layer covering the mesa, the passivation layer having a passivation layer top surface and an opening over the mesa that has a first width, wherein the opening defines passivation layer sidewalls adjacent to the semiconductor surface;
    the Schottky contact disposed in the opening on the semiconductor surface, the Schottky contact having a contact top surface and contact sidewalls along an extent from the semiconductor surface to the contact top surface, wherein the contact sidewalls are in direct contact with the passivation layer sidewalls, and a width of the Schottky contact equals the first width;
    a further conductor on the contact top surface of the Schottky contact and extending over portions of the passivation layer top surface on either side of the Schottky contact, the further conductor having a second width greater than the first width; and
    spaced-apart Ohmic source and drain contacts on the mesa, which are separated from the Schottky contact,
    wherein the passivation layer to surface is at a first height above the semiconductor surface, and the Schottky contact has a second height above the semiconductor surface that is less than the first height, and
    wherein the Schottky contact directly contacts the upper portion of the semiconductor.

2. The device of claim 1, wherein the semiconductor device is a field effect transistor and the Schottky contact is a control gate of the field effect transistor.

3. The device of claim 1, wherein the semiconductor comprises a type IV, III-V or II-VI material or a combination thereof.

4. The device of claim 3, wherein the semiconductor comprises GaN.

5. The device of claim 1, wherein the passivation layer comprises $Si_3N_4$, $SiO_2$, $SiO_xN_y$, AlN, $Al_2O_3$, $HfO_2$, or combinations thereof.

6. The device of claim 1, wherein the Schottky contact comprises Ni, Au, Pt, Pt—Au, Ni—Au, Ir, Ir—Au, Pd, Pd—Au, TiW, TiWN or combinations thereof.

7. The device of claim 1, wherein the further conductor comprises Au, Ni—Au, Pt—Au, or combinations thereof.

8. The device of claim 1, wherein the further conductor directly contacts the passivation layer.

9. A semiconductor device with a Schottky contact, the semiconductor device comprising:
    a semiconductor that includes a mesa, wherein the mesa is defined by a first portion of the semiconductor that is thicker than a second portion of the semiconductor;
    a passivation layer on a surface of the semiconductor and partially covering the mesa, wherein the passivation layer includes an opening having a first width, wherein the opening exposes a first portion of the mesa, and wherein passivation layer sidewalls are adjacent to the first portion of the mesa;
    a Schottky contact on the first portion of the surface of the semiconductor, the Schottky contact having a contact top surface and contact sidewalls along an extent from the first portion of the mesa to the contact top surface, wherein the contact sidewalls are in direct contact with the passivation layer sidewalls, and a width of the Schottky contact equals the first width; and
    a step-gate conductor coupled to the contact top surface, wherein the step-gate conductor has a second width that is greater than the first width, and the step-gate conductor overlies parts of the passivation layer adjacent to the Schottky contact; and
    spaced-apart Ohmic source and drain contacts on the mesa, separated from the Schottky contact,
    wherein a passivation layer to surface of the passivation layer is at a first height above the surface of the semiconductor, and the Schottky contact has a second height above the surface of the semiconductor that is less than the first height, and
    wherein the Schottky contact directly contacts the first portion of the semiconductor.

10. The device of claim 9, wherein the semiconductor comprises a type IV, III-V, II-VI material or combinations thereof.

11. The device of claim 10, wherein the semiconductor comprises GaN, SiC, AlGaN or combinations thereof.

12. The device of claim 9, wherein the step-gate conductor directly contacts the passivation layer.

* * * * *